US012622246B2

(12) United States Patent
Yang et al.

(10) Patent No.: US 12,622,246 B2
(45) Date of Patent: May 5, 2026

(54) MANDREL-PULL-FIRST INTERCONNECT PATTERNING

(71) Applicant: International Business Machines Corporation, Armonk, NY (US)

(72) Inventors: Xiaoming Yang, Clifton Park, NY (US); Yann Mignot, Slingerlands, NY (US); Somnath Ghosh, Clifton Park, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 643 days.

(21) Appl. No.: 17/985,138

(22) Filed: Nov. 10, 2022

(65) Prior Publication Data

US 2024/0162087 A1 May 16, 2024

(51) Int. Cl.
H01L 21/768 (2006.01)
H01L 21/027 (2006.01)
H01L 21/033 (2006.01)

(52) U.S. Cl.
CPC .... H01L 21/76877 (2013.01); H01L 21/0272 (2013.01); H01L 21/0332 (2013.01); H01L 21/76802 (2013.01)

(58) Field of Classification Search
CPC ............. H01L 21/0272; H01L 21/0332; H01L 21/76802; H01L 21/0337; H01L 21/31144; H01L 21/76816
See application file for complete search history.

(56) References Cited

U.S. PATENT DOCUMENTS

| | | | |
|---|---|---|---|
| 9,368,349 B2 | 6/2016 | Huang | |
| 9,478,462 B1 | 10/2016 | Wang et al. | |
| 9,548,243 B1 | 1/2017 | Briggs | |
| 9,905,424 B1 * | 2/2018 | Law | H01L 21/0337 |
| 9,941,154 B2 | 4/2018 | Song et al. | |
| 10,446,395 B1 | 10/2019 | Shu | |
| 10,573,528 B2 | 2/2020 | Lie et al. | |
| 10,580,651 B2 | 3/2020 | Sung | |
| 10,872,777 B2 | 12/2020 | Pan | |
| 11,239,077 B2 | 2/2022 | Liu | |
| 12,376,310 B2 * | 7/2025 | Jiang | H10B 51/20 |
| 2013/0065397 A1 | 3/2013 | Chen | |
| 2013/0237050 A1 * | 9/2013 | Kikutani | H10B 43/10 |
| | | | 438/618 |
| 2014/0282289 A1 | 9/2014 | Hsu et al. | |
| 2020/0098580 A1 * | 3/2020 | Pan | H10D 88/01 |
| 2024/0074205 A1 * | 2/2024 | Lin | H10B 51/10 |
| 2024/0126011 A1 * | 4/2024 | Sharma | G01S 7/4818 |

OTHER PUBLICATIONS

Ban, Y., Miloslavsky, A., Lucas, K., Choi, S. H., Park, C. H., & Pan, D. Z. (Apr. 2011). Layout Decomposition of Self-Aligned Double Patterning for 2D Random Logic Patterning. In Design for Manufacturability through Design-Process Integration V (vol. 7974, pp. 158-172). SPIE.

(Continued)

*Primary Examiner* — Karen Kusumakar

(74) *Attorney, Agent, or Firm* — Harrity & Harrity, LLP

(57) ABSTRACT

A semiconductor structure includes a substrate; a spacer protruding from the substrate and surrounding a cavity; and spin-on glass filling a portion of the cavity.

13 Claims, 11 Drawing Sheets

(56)                           References Cited

OTHER PUBLICATIONS

Liu, E., Ko, A., Farrell, R., O'Meara, D., Hsieh, C. Y., & Biolsi, P. (Apr. 2018). Multi-color approach on self-aligned multiple patterning for single line cut application. In Novel Patterning Technologies 2018 (vol. 10584, pp. 33-41). SPIE.
Shu, J. Innovation on Line Cut Methods of Self-aligned Multiple Patterning.

* cited by examiner

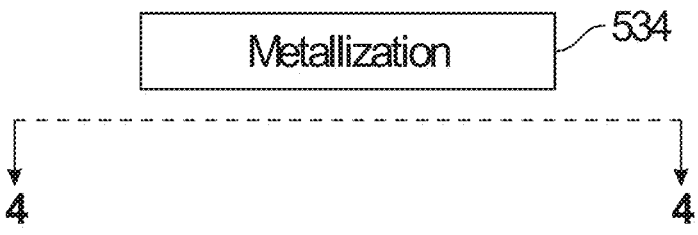
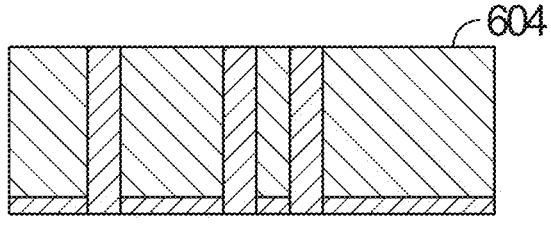
*FIG. 3*
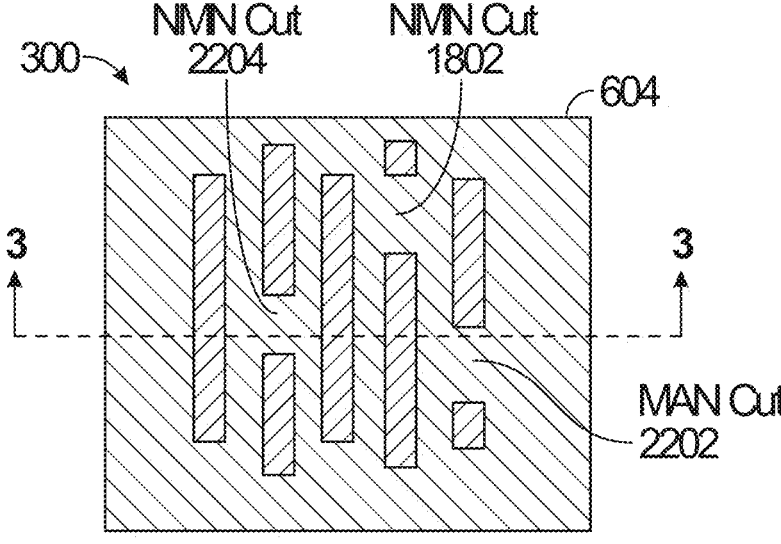
*FIG. 4*

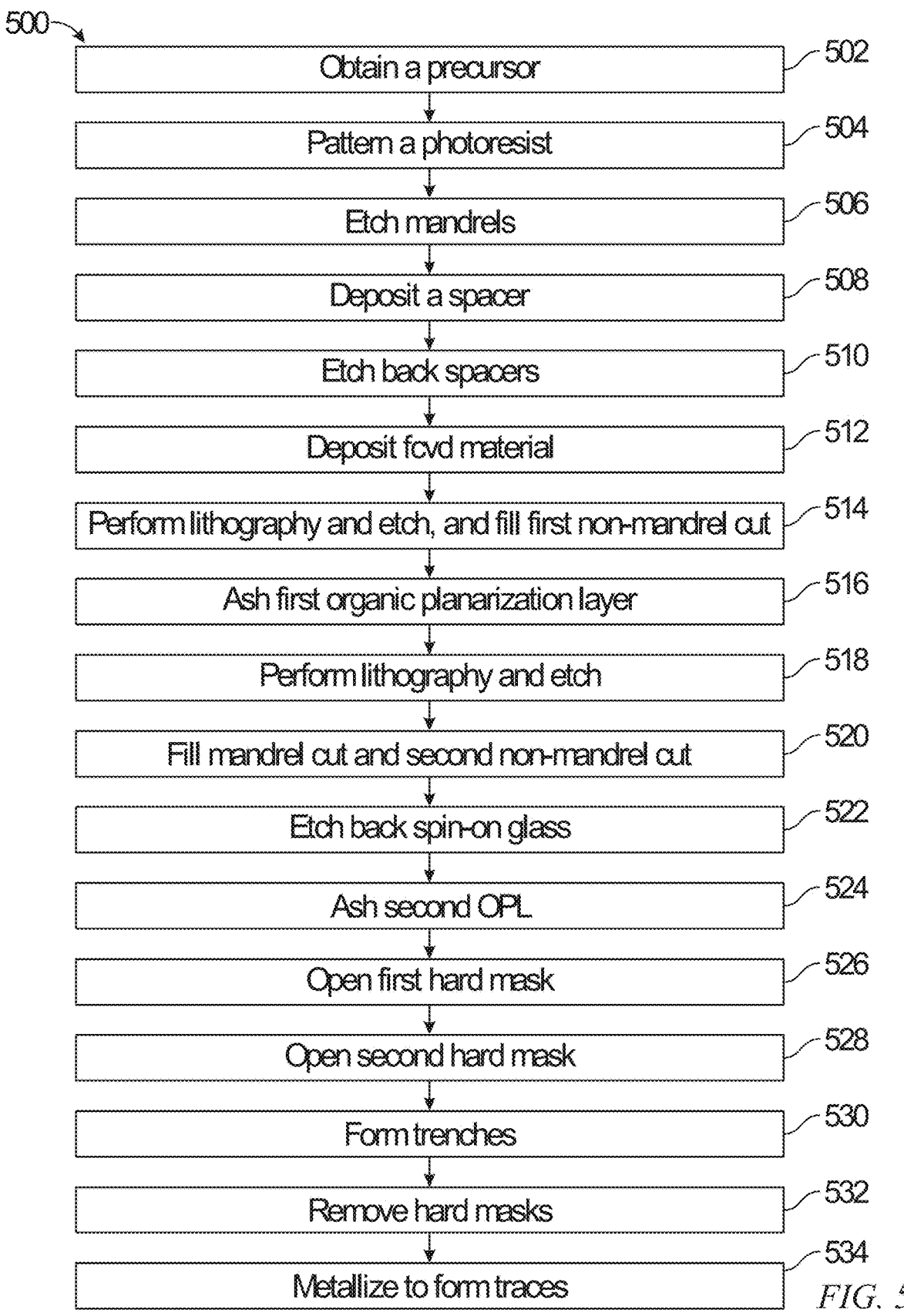

500

502 — Obtain a precursor

504 — Pattern a photoresist

506 — Etch mandrels

508 — Deposit a spacer

510 — Etch back spacers

512 — Deposit fcvd material

514 — Perform lithography and etch, and fill first non-mandrel cut

516 — Ash first organic planarization layer

518 — Perform lithography and etch

520 — Fill mandrel cut and second non-mandrel cut

522 — Etch back spin-on glass

524 — Ash second OPL

526 — Open first hard mask

528 — Open second hard mask

530 — Form trenches

532 — Remove hard masks

534 — Metallize to form traces

*FIG. 5*

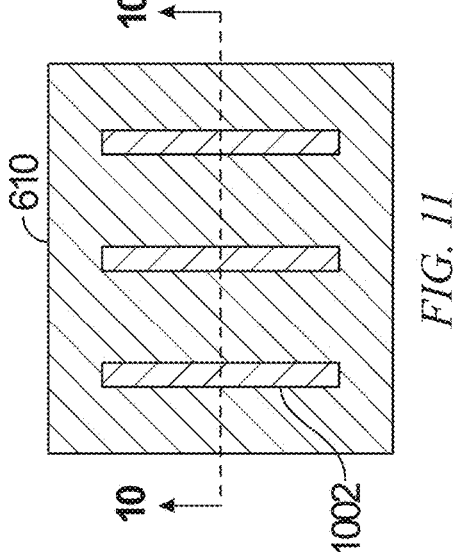
FIG. 11
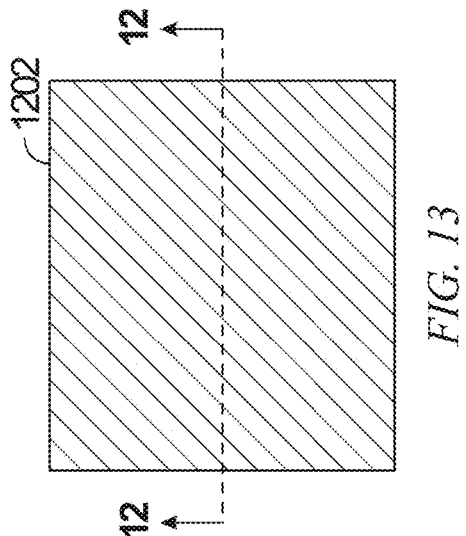
FIG. 13
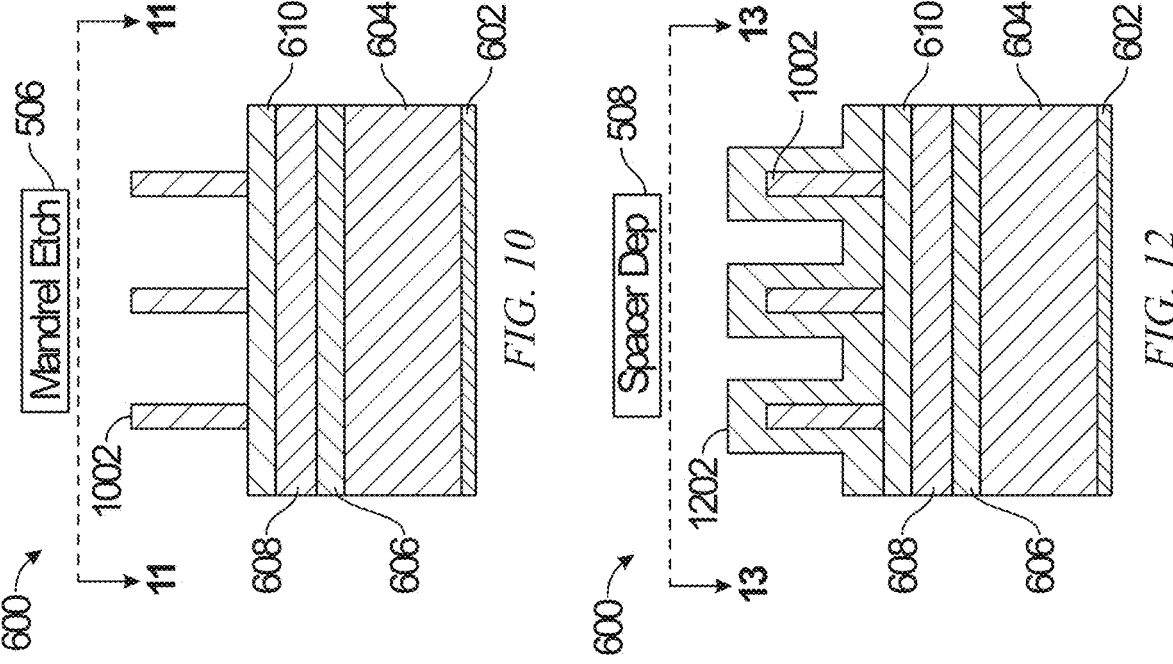
FIG. 10
FIG. 12

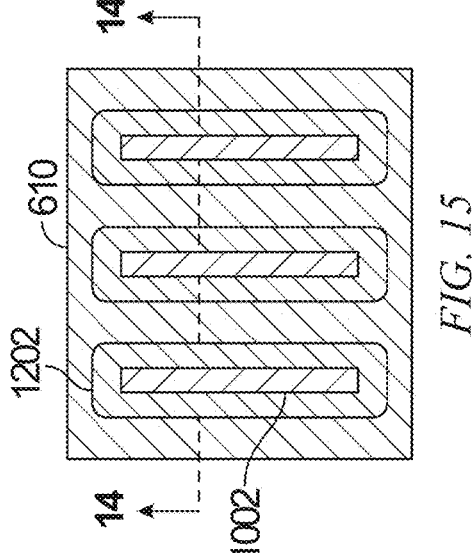
*FIG. 15*
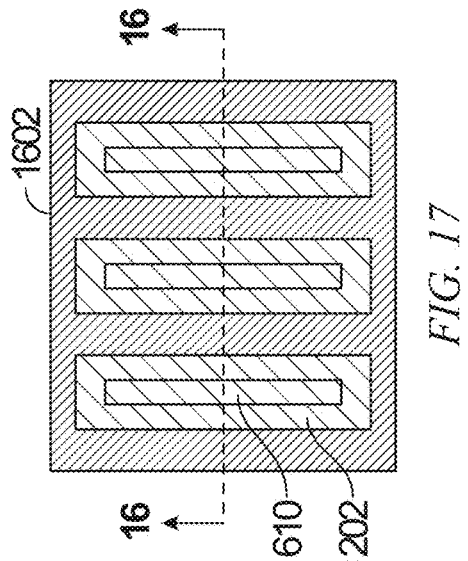
*FIG. 17*
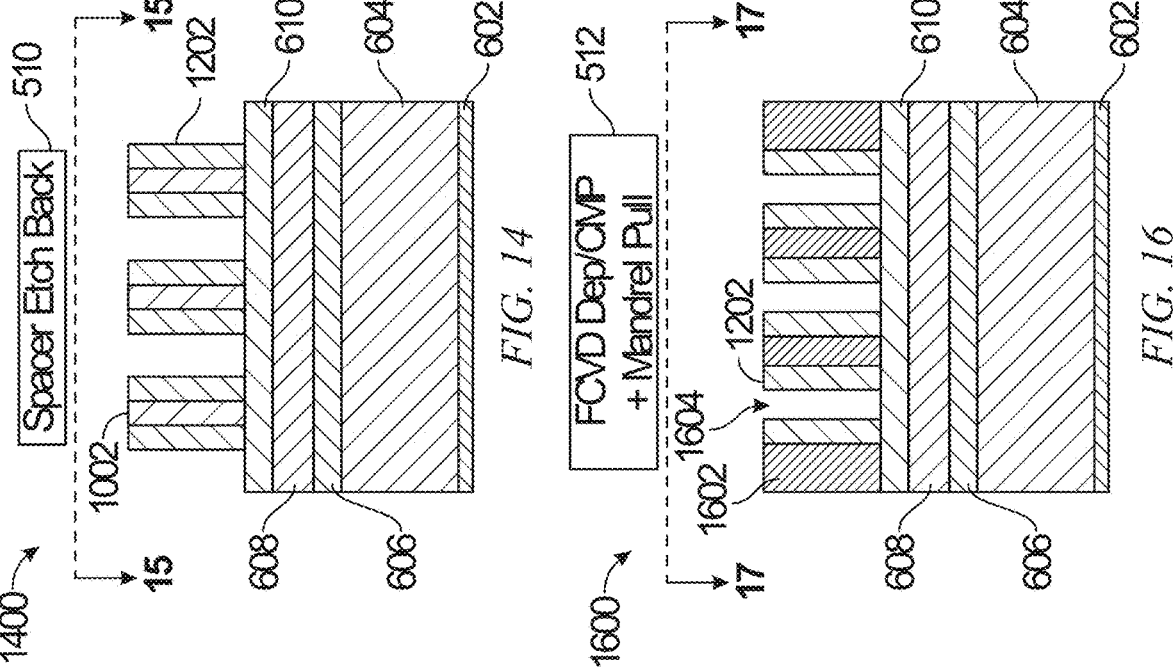
*FIG. 14*
*FIG. 16*

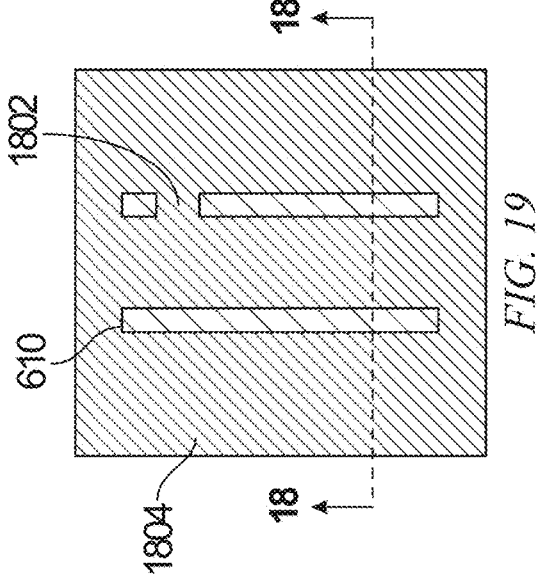
FIG. 19
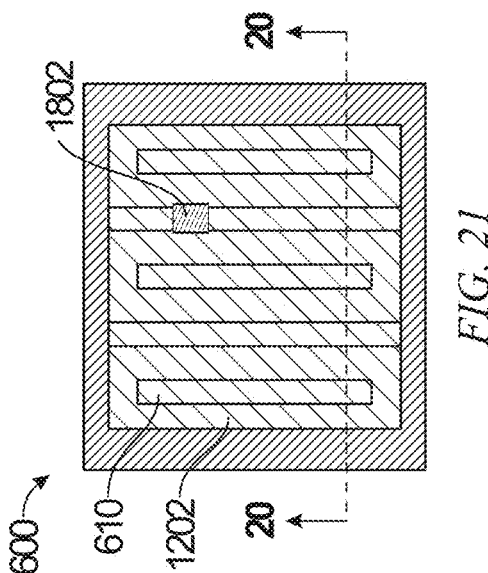
FIG. 21
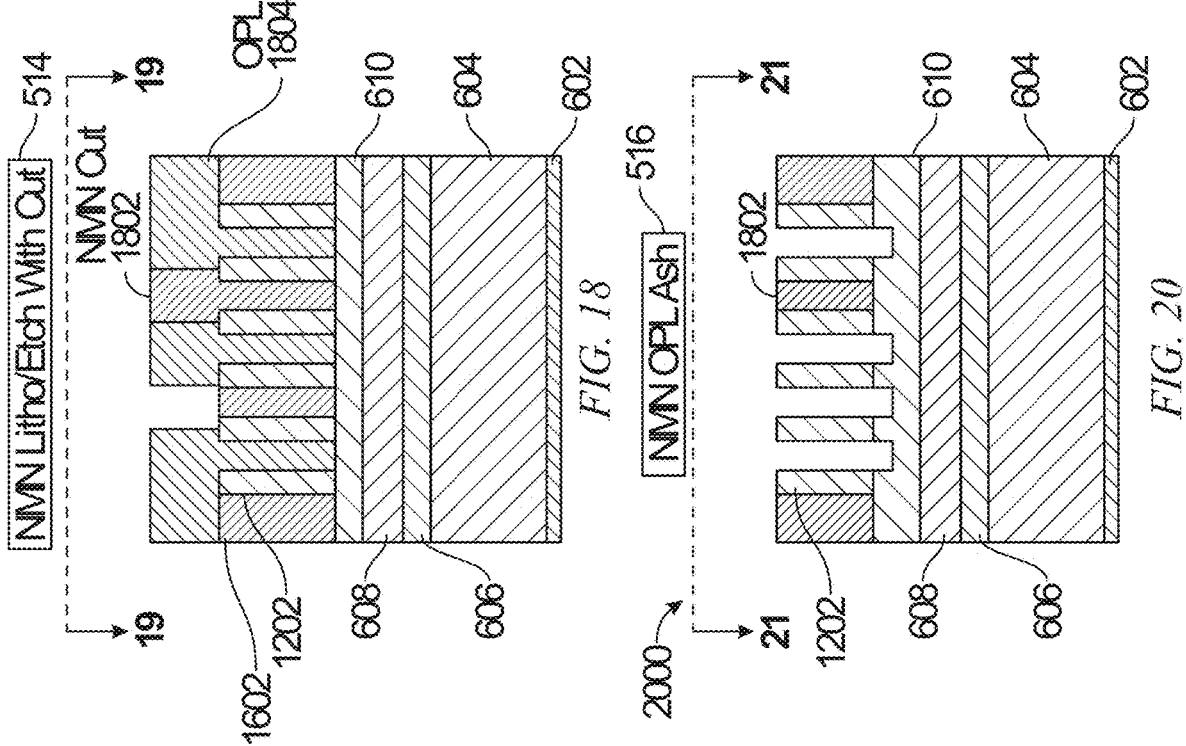
FIG. 18
FIG. 20

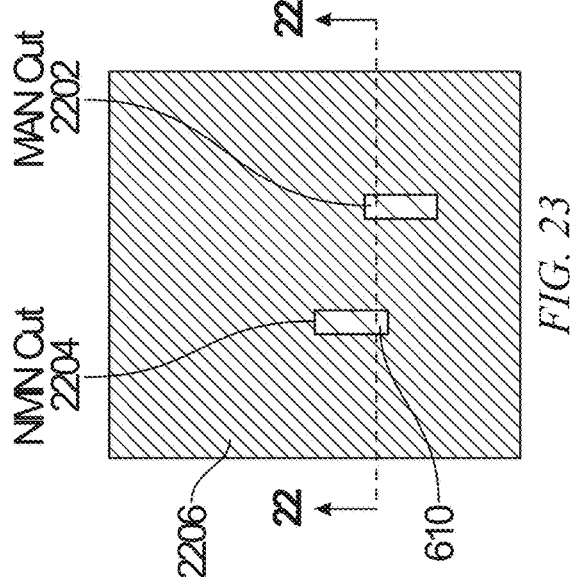
*FIG. 23*
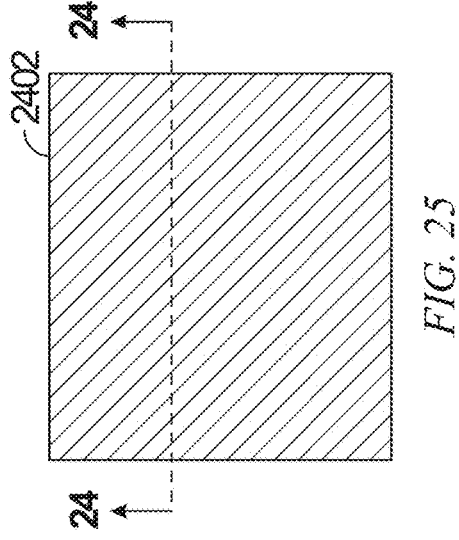
*FIG. 25*
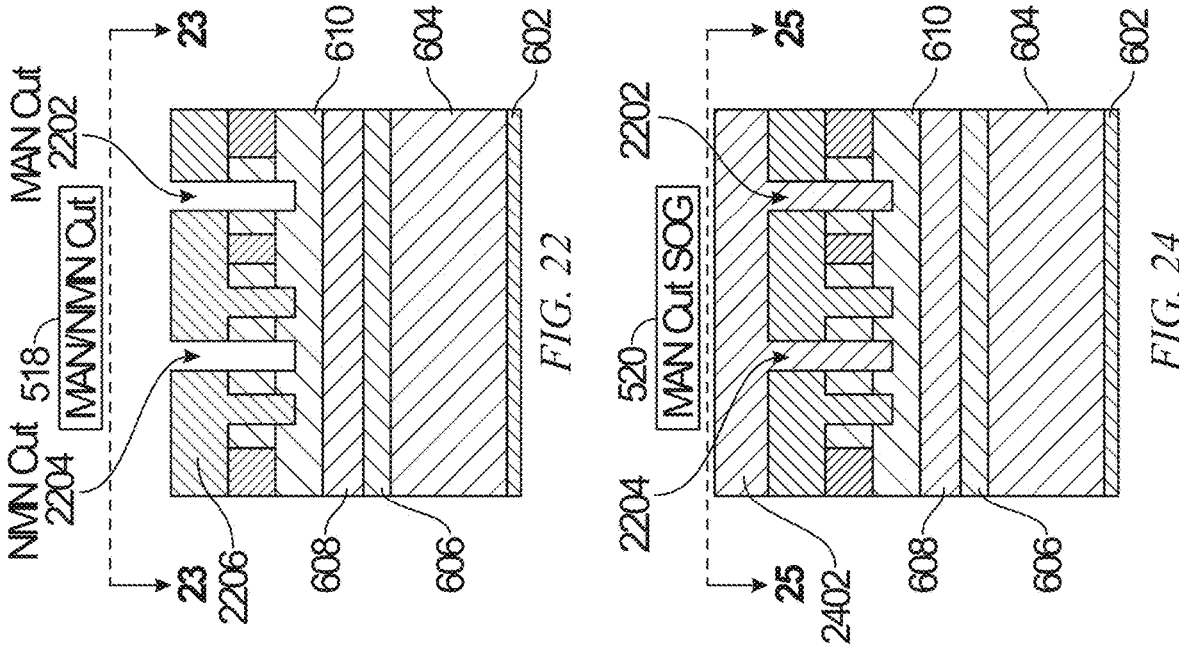
*FIG. 22*
*FIG. 24*

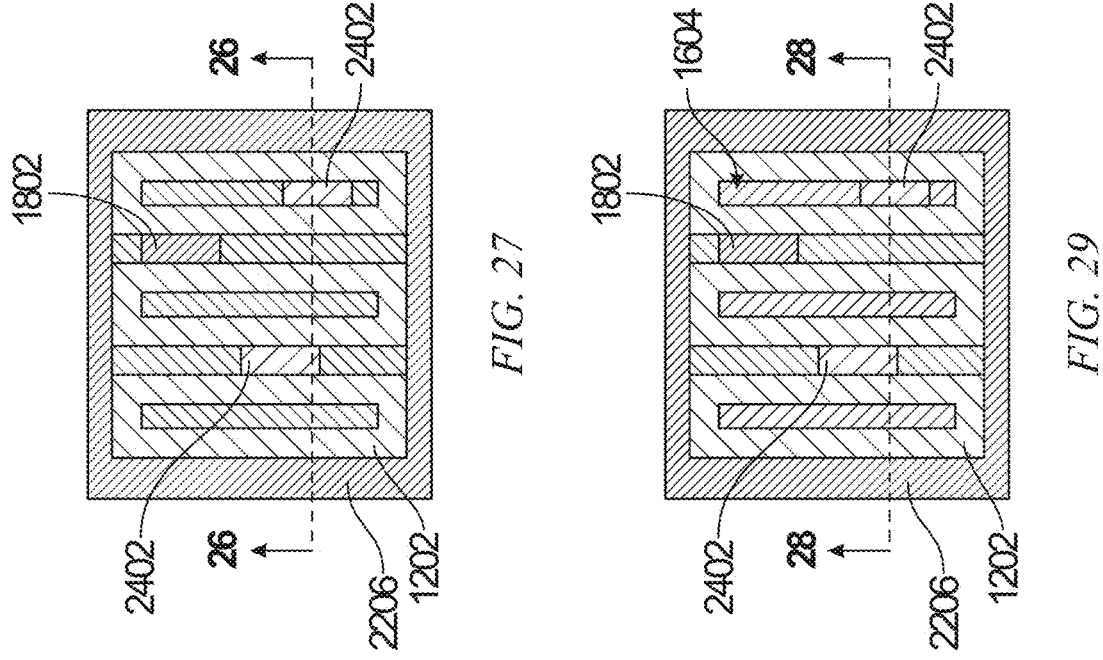
*FIG. 27*
*FIG. 29*
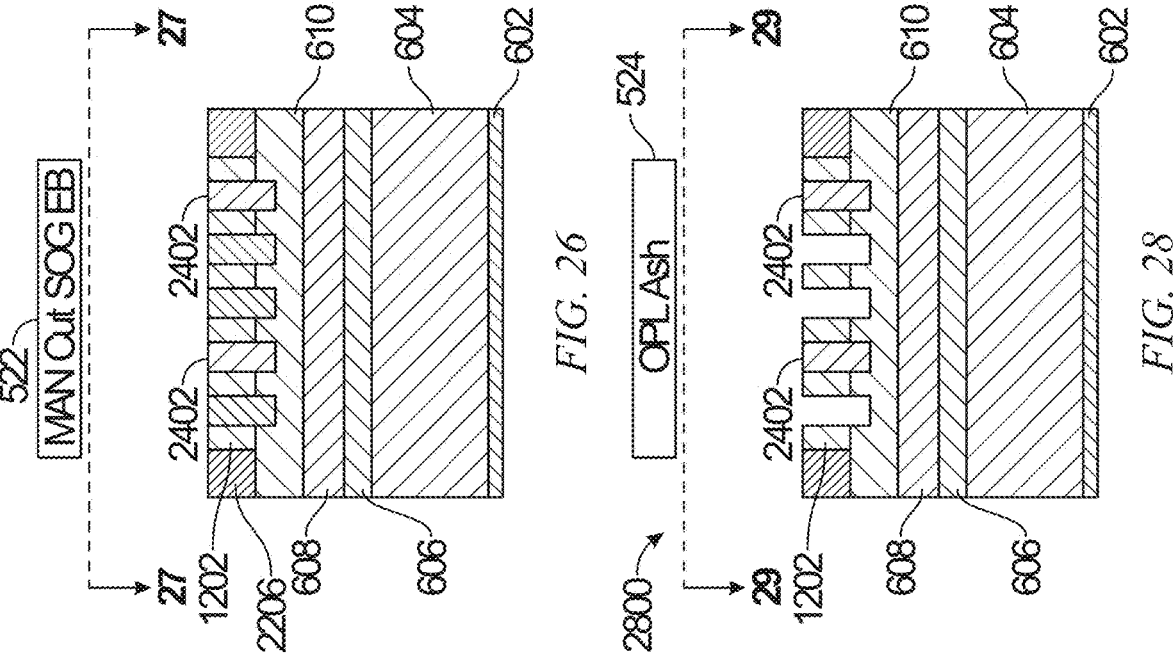
*FIG. 26*
*FIG. 28*

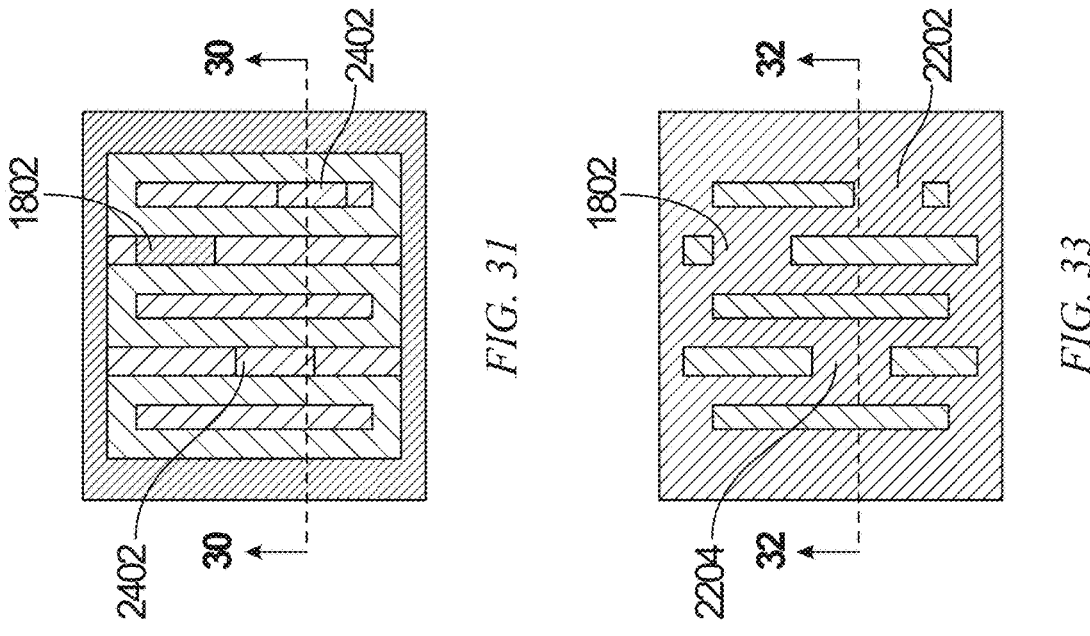
FIG. 31
FIG. 33
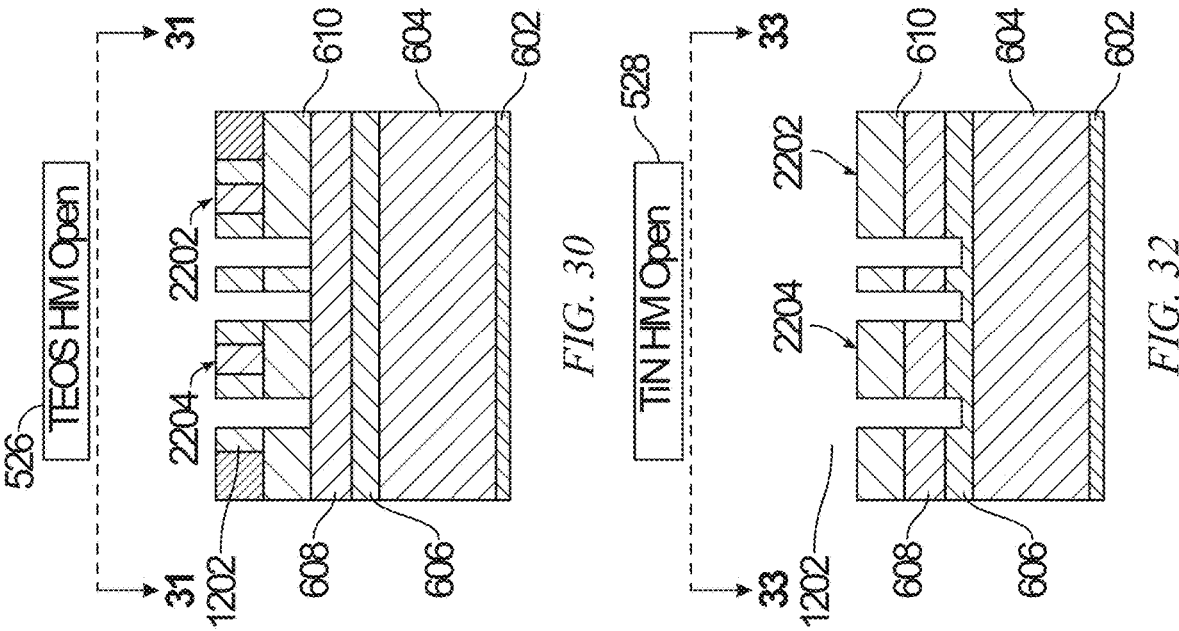
FIG. 30
FIG. 32

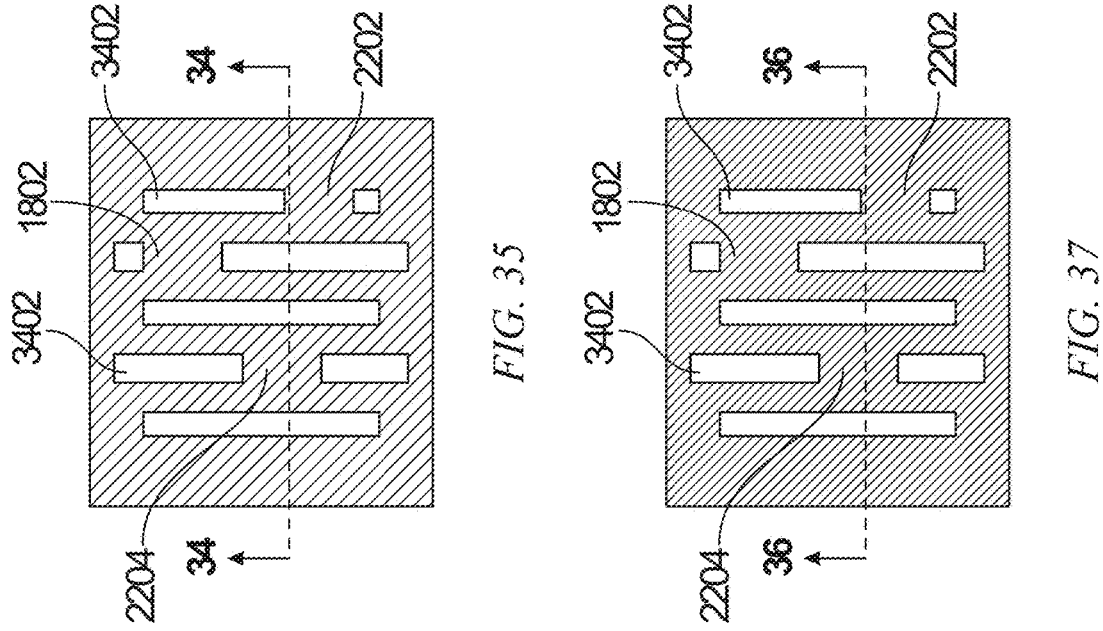
FIG. 35
FIG. 37
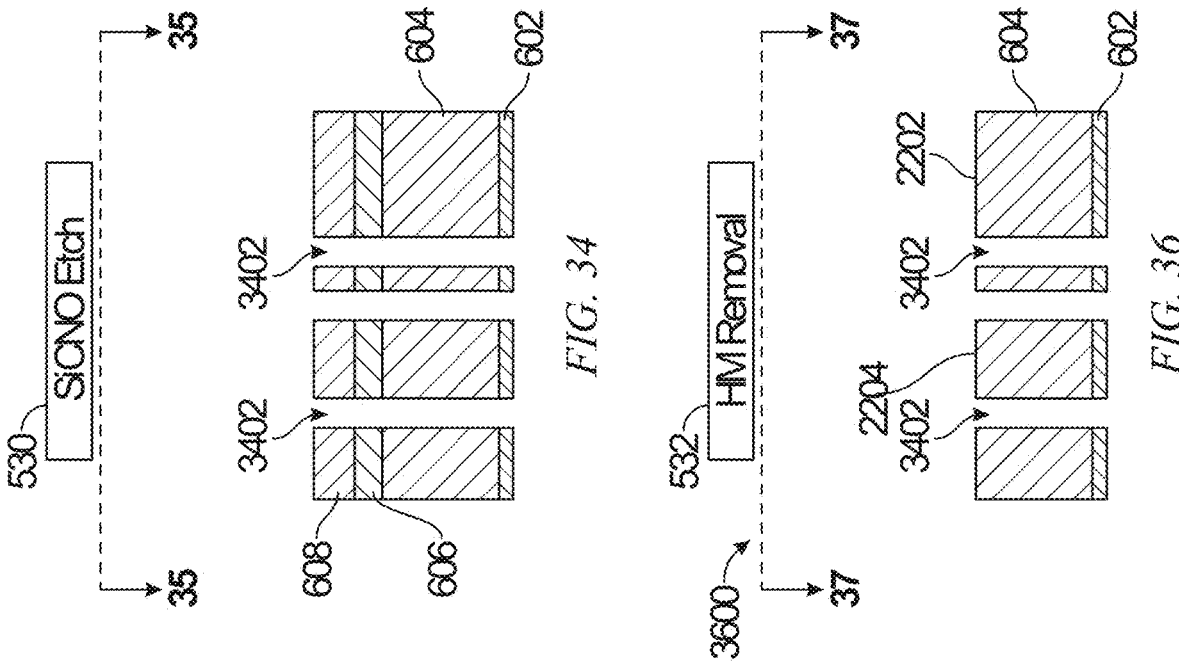
FIG. 34
FIG. 36

MANDREL-PULL-FIRST INTERCONNECT PATTERNING

BACKGROUND

The present invention relates to the electrical, electronic, and computer arts, and more specifically, to fabricating semiconductor devices.

Conventionally, metal traces in the interconnect layers of modern semiconductor devices are formed by a process known as self-aligned double patterning (SADP). SADP uses iterative deposition techniques to overcome the known problem that modern feature sizes are too small to be accurately formed using photolithographic techniques alone. That is, current process nodes have sub-wavelength features that are smaller than the extreme ultraviolet (EUV) wavelength that is used for photolithography. SADP uses sacrificial spacers to reduce the feature size to approximately half of the minimum size that can be achieved using EUV photolithography.

FIG. 1 depicts, in a photomicrograph, metal traces 100 that were formed in a substrate 102 by self-aligned double patterning, according to the prior art. There are bumps 104, 106 on the sides of "non-mandrel" traces 108, 110. The bumps 104, 106 were produced due to the phenomenon of "spacer pinch-off" In extreme cases, the bumps 104, 106 can extend across the gaps 112, 114 that separate the traces 116, 118, 120. If the bumps extend across the gaps, they form what are called "non-mandrel line bridges." This occurs when the gaps are too broad. On the other hand, if a gap (e.g., gap 112) is too narrow, then the spacer does not properly pinch off, and there will be a "mandrel line bridge" 122 between, e.g., trace 116 and trace 118.

FIG. 2 depicts, in a schematic, a spacer pinch off step 200 of a prior art process that is used for forming the metal traces 100 that are shown in FIG. 1. Note the spacers 202 surround mandrels 204. Gaps 206 between the mandrels (mandrel cuts) were previously formed by etching, e.g., photolithography. The mandrels 204 will later be replaced by metal mandrel lines, such as the traces 116, 118, 120 that are shown in FIG. 1. Non-mandrel gaps 208 between the spacers 202 will later be replaced by non-mandrel lines, such as the traces 108, 110 that are shown in FIG. 1. As an inherent artifact of the deposition process that was used to form the spacers 202, at each gap 206, the spacers have indentations 210. When traces are formed in the non-mandrel gaps 208, indentations such as the indentations 210 will produce bumps such as the bumps 104, 106. The ordinary skilled worker will appreciate that widening the gaps 206 would enlarge the indentations 210 and the bumps 104, 106, which could result in non-mandrel line bridges. Further, narrowing the gaps 206 could prevent the spacers 202 fully filling the gaps, which could result in mandrel line bridges. It is not possible to replicate the critical dimensions of mandrel cuts and the thickness of spacers across the entirety of a wafer. Therefore, the process variation inevitably produces line bridges that detract from product yield.

SUMMARY

Principles of the invention provide techniques for mandrel-pull-first interconnect patterning. In one aspect, an exemplary method includes obtaining a preliminary structure that includes a substrate, a mandrel protruding from the substrate, and a spacer surrounding the mandrel; forming a first structure, which includes the substrate with the spacer protruding from the substrate and surrounding a cavity, by pulling the mandrel from the preliminary structure; forming a second structure by depositing a first organic planarization layer (OPL) onto the first structure, etching a first non-mandrel cut into the first OPL at a position that is not aligned in registry with the cavity of the spacer, depositing a filler into the first non-mandrel cut, ashing the first OPL, and etching back the filler; forming a third structure by depositing a second OPL onto the second structure, etching a second non-mandrel cut and a mandrel cut into the second OPL, wherein the mandrel cut is at a position that is aligned in registry with the cavity of the spacer, filling the second non-mandrel cut and the mandrel cut with spin-on glass, and ashing the second OPL; forming a fourth structure by opening a top hard mask of the substrate in predetermined areas not covered by the spacer, the filler, and the spin-on glass, then opening a lower hard mask of the substrate in the predetermined areas, then etching trenches in the same areas through a covering layer of the substrate and into a dielectric body of the substrate, then removing the hard masks; and forming a metallized structure in the body of the substrate by filling a metal into the trenches of the fourth structure. The metal does not fill the trenches in areas that were covered by the spacer, the filler, and the spin-on glass.

According to another aspect, a semiconductor structure includes a substrate; a spacer protruding from the substrate and surrounding a cavity; and spin-on glass filling a portion of the cavity.

In view of the foregoing, techniques of the present invention can provide substantial beneficial technical effects. For example, one or more embodiments provide self-aligned double patterning of interconnect layers without line bridges.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 3 and FIG. 4 depict, in schematics, metal traces to be formed in a substrate by a self-aligned double patterning process, according to exemplary embodiments.

FIG. 5 depicts, in a flowchart, steps of the self-aligned double patterning process to form the metal traces that are shown in FIG. 3 and FIG. 4, according to exemplary embodiments.

FIG. 6 through FIG. 37 depict, in schematics, structures to be produced by steps of the process that is shown in FIG. 5, according to exemplary embodiments.

DETAILED DESCRIPTION

FIG. 3 and FIG. 4 depict, in schematics, metal traces 300 that are formed in a substrate 604 by self-aligned double patterning, according to exemplary embodiments. Certain traces are broken by cuts 1802, 2202, 2204. The traces 300 do not have bumps adjacent to the cuts. This is because the traces 300 are to be formed according to a process 500, steps of which are shown in FIG. 5. FIG. 3 and FIG. 4 show the conclusion of the process 500, at a step 534 of metallizing trenches that are formed in a manner further discussed below.

FIG. 5 depicts, in a flowchart, steps of the self-aligned double patterning process 500 to form the metal traces 300 that are shown in FIG. 3 and FIG. 4, according to exemplary embodiments. FIG. 6 through FIG. 37 depict, in schematics, structures to be produced by steps of the process that is shown in FIG. 5, according to exemplary embodiments. Even numbered FIGS. 6, 8, etc. are vertical cross-section views while odd numbered FIGS. 7, 9, etc. are top-down plan views that correspond to the preceding even numbered figures.

Figure 1:
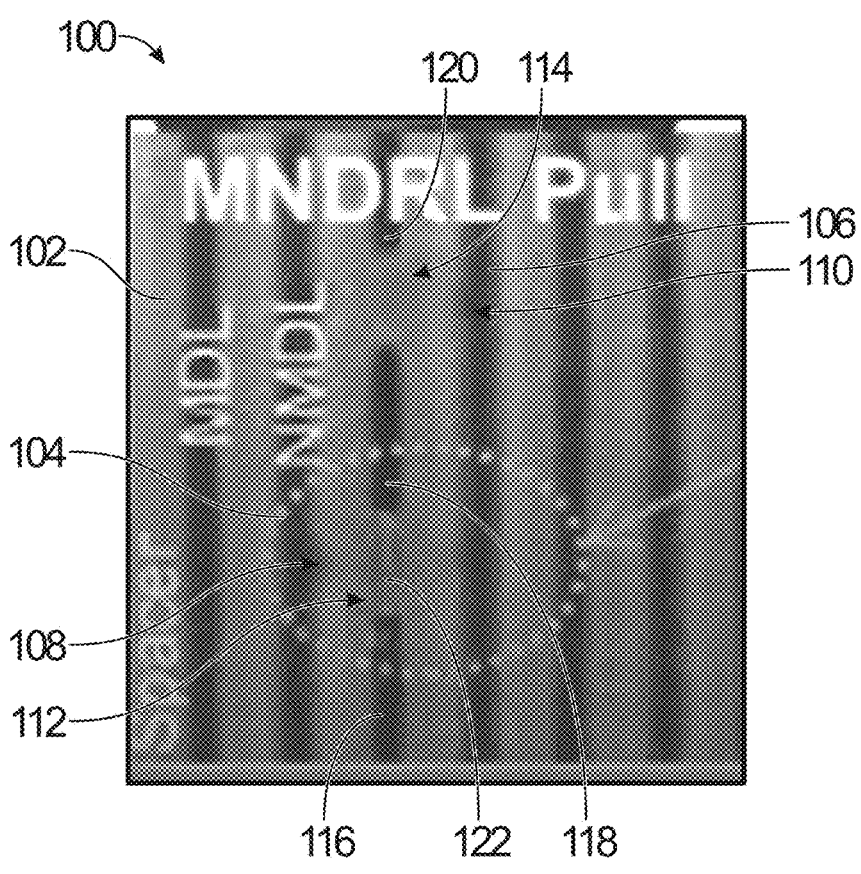
FIG. 1 depicts, in a photomicrograph, metal traces that were formed in a substrate by self-aligned double patterning, according to the prior art.
Figure 2:
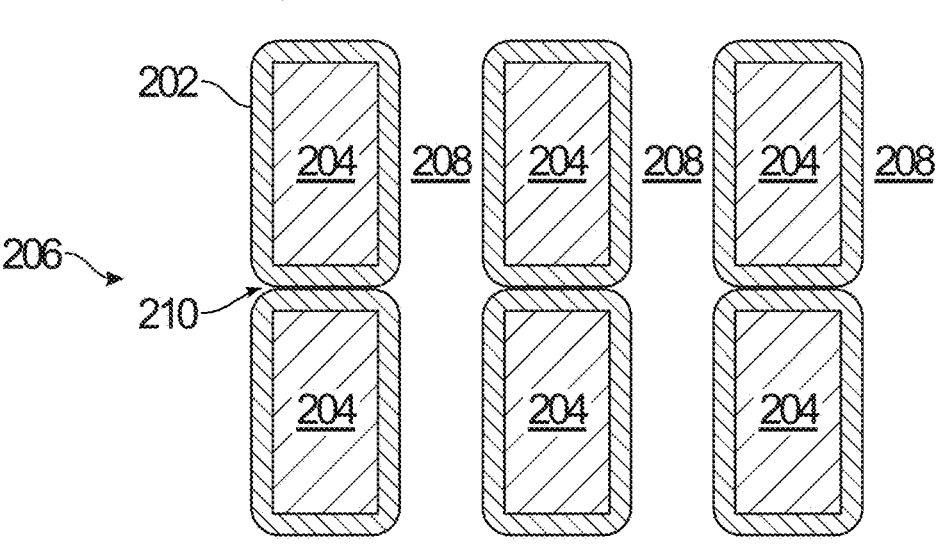
FIG. 2 depicts, in a schematic, a spacer pinch off step of a prior art process that is used for forming the metal traces that are shown in FIG. 1.
Figures 6, 7, 8, 9:
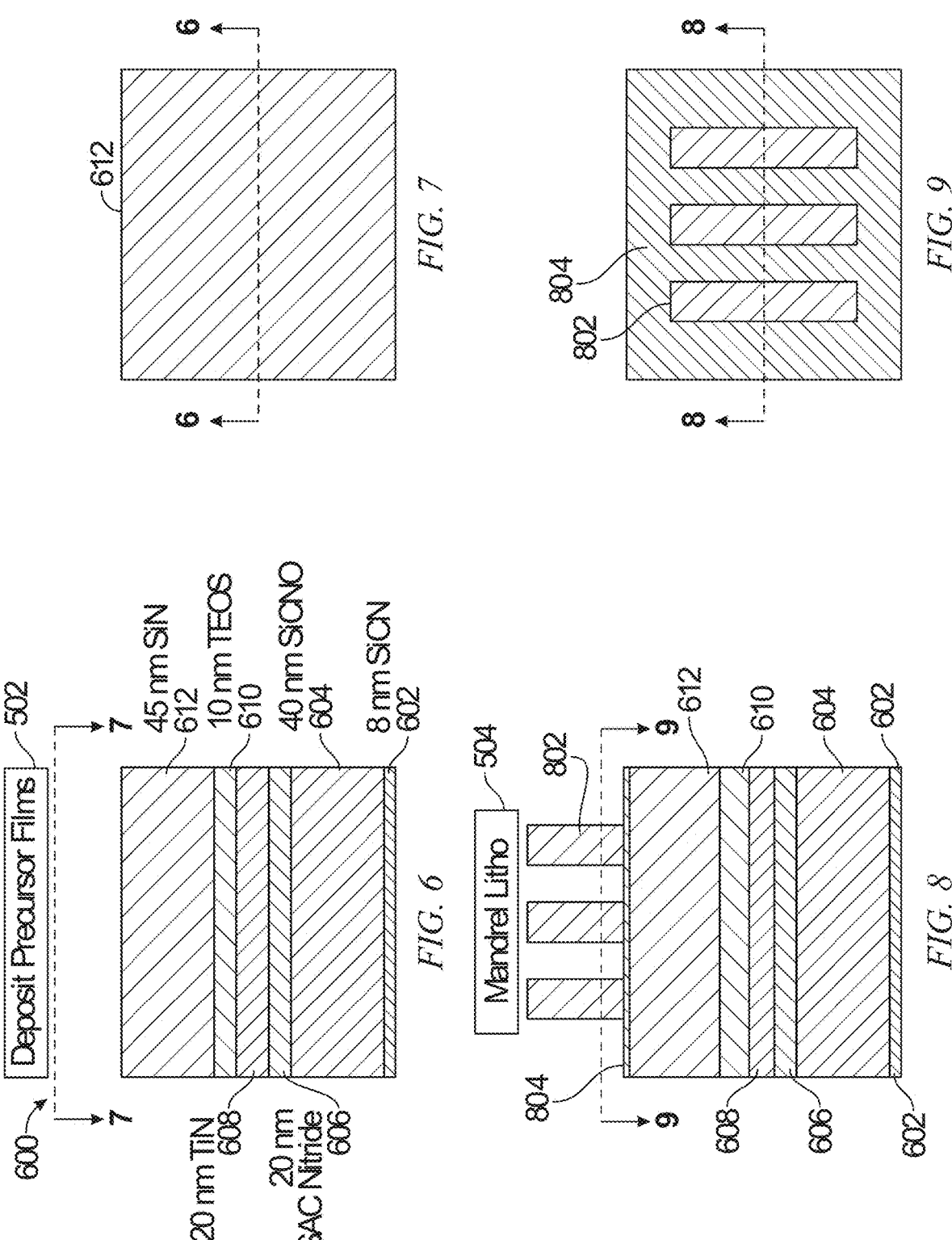

Referring to FIGS. 5, 6, and 7, at 502, obtain a precursor 600 that includes a base layer 602 (e.g., silicon carbonitride (SiCN) 8 nm thick), a body layer 604 (e.g., silicon cyanate (SiCNO) 40 nm thick), a covering layer 606 (e.g., SAC (i.e., sacrificial) nitride 20 nm thick), a first hard mask 608 (e.g., titanium nitride 20 nm thick), a second hard mask 610 (e.g., tetraethylorthosilicate (TEOS) 10 nm thick), and a third hard mask 612 (e.g., silicon nitride (SiN) 45 nm thick).

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Referring to FIGS. 5, 8, and 9, at 504, pattern a photoresist 802. Under the photoresist there is a bottom anti-reflective-coating 804.

Referring to FIGS. 5, 10, and 11, at 506, etch mandrels 1002 in the SiN hard mask 612, based on the patterned photoresist 802 from step 504. Where material is removed around the mandrels, the hard mask 610 is exposed.

At 508, as shown in FIGS. 12 and 13, form a structure 1200 by depositing a spacer 1202 that covers the mandrels 1002. Suitable materials for the spacer 1202 include, e.g., TiN, TiO$_x$, AlN, AlO$_x$. Then at 510, as shown in FIGS. 14 and 15, etch back the spacers 1202 to expose tops of the mandrels 1002. Further, at 512, as shown in FIGS. 16 and 17, deposit a flowable chemical vapor deposition (FCVD) material 1602—e.g., an organoaminosilane compound, a trisilylamine compound, or the like—then perform chemical mechanical planarization (CMP) and "pull" the mandrels 1002 by etching the silicon nitride selective to the spacers 1202. Pulling the mandrels forms cavities 1604 in a structure 1600.

At 514, as shown in FIGS. 18 and 19, perform lithography and etching to form a "non-mandrel" cut 1802 in the FCVD layer 1602. The "cut" 1802 overlies a portion of the structure where the mandrels were not present, and is filled with a filler such as, e.g., SiOC, FCVD material, spin-on glass (SOG), TiO$_x$, AlN, AlO$_x$. In one or more embodiments, the filler is the same material as the FCVD material 1602. A first organic planarization layer (OPL) 1804 fills and covers the structure around the cut.

At 516, ash the first OPL 1804 of the structure of FIGS. 18 and 19 to obtain the structure of FIGS. 20 and 21.

At 518, as shown in FIGS. 22 and 23, perform lithography and etching to form a mandrel cut 2202 (overlying where the mandrel was before) and a second non-mandrel cut 2204 that are surrounded by a second organic planarization layer 2206. Whereas the mandrel cut can be quite close to the first non-mandrel cut (i.e. within about 20 nm), the mandrel cut is separated from the second non-mandrel cut by a certain distance (e.g., at least 48 nm in one or more embodiments). The cuts expose the hard mask 610. At 520, as shown in FIGS. 24 and 25, fill the mandrel cut and the second non-mandrel cut with spin-on glass 2402.

Referring to FIGS. 26 and 27, at 522, etch back the spin-on glass 2402 to again reveal the spacer 1202. At 524, ash the second OPL 2206 of FIGS. 22 and 23 to produce the structure as shown in FIGS. 28 and 29. Referring to FIGS. 30 and 31, at 526, open the first (e.g., tetraethylorthosilicate) hard mask 610 to reveal the titanium nitride hard mask 608 between the spacers 1202. Then, at 528, as shown in FIGS. 32 and 33, open the titanium nitride hard mask 608 to reveal the nitride layer 606. At 530, as shown in FIGS. 34 and 35, form trenches 3402 by etching the silicon cyanate layer 604. At 532, as shown in FIGS. 36 and 37, remove the hard masks. At 534, as shown in FIGS. 3 and 4, deposit the metal traces 300 to fill the trenches where they are not blocked by the spin-on glass 2402 or the filler 1802.

Given the discussion thus far, it will be appreciated that, in general terms, an exemplary method, according to an aspect of the invention, includes obtaining a preliminary structure 1400 that includes a substrate, a mandrel protruding from the substrate, and a spacer surrounding the mandrel; forming a first structure 1600, which includes the substrate 602, 604, 606, 608, 610 with the spacer 1202 protruding from the substrate and surrounding a cavity 1604, by pulling the mandrel from the preliminary structure; forming a second structure 2000 by depositing a first organic planarization layer (OPL) 1804 onto the first structure, etching a first non-mandrel cut 1802 into the first OPL at a position that is not aligned in registry with the cavity of the spacer, depositing a filler into the first non-mandrel cut, ashing the first OPL, and etching back the filler; forming a third structure 2800 by depositing a second OPL 2206 onto the second structure, etching a second non-mandrel cut 2204 and a mandrel cut 2202 into the second OPL, wherein the mandrel cut is at a position that is aligned in registry with the cavity of the spacer, filling the second non-mandrel cut and the mandrel cut with spin-on glass 2402, and ashing the second OPL; forming a fourth structure 3600 by opening a top hard mask of the substrate in predetermined areas not covered by the spacer, the filler, and the spin-on glass, then opening a lower hard mask of the substrate in the predetermined areas, then etching trenches 3402 in the same areas through a covering layer 606 of the substrate and into a dielectric body 604 of the substrate, then removing the hard masks; and forming a metallized structure 300 in the body of the substrate by filling a metal into the trenches of the fourth structure. The metal does not fill the trenches in areas that were covered by the spacer, the filler, and the spin-on glass.

In one or more embodiments, pulling the mandrel includes etching the preliminary structure selective to the spacers.

In one or more embodiments, depositing the filler includes depositing a material selected from the list consisting of: silicon oxycarbide, spin-on glass, flowable chemical vapor deposition (CVD) material, titanium oxide, aluminum oxide, aluminum nitride.

In one or more embodiments, filling the metal includes vapor deposition of a metal selected from the list consisting of: copper, rhodium, ruthenium, tungsten, platinum, palladium, silver, gold.

In one or more embodiments, opening the top hard mask includes applying an etchant suitable for removing tetraethylorthosilicate.

In one or more embodiments, opening the lower hard mask includes applying an etchant suitable for removing titanium nitride.

In one or more embodiments, etching trenches includes applying an etchant suitable for removing silicon cyanate.

According to another aspect, an exemplary semiconductor structure 2800 includes a substrate 602, 604, 606, 608, 610; a spacer 1202 that protrudes from the substrate and surrounds a cavity 1604; and spin-on glass 2402 that fills a portion of the cavity.

In one or more embodiments, the substrate includes a tetraethylorthosilicate hard mask under the spacer. In one or more embodiments, the tetraethylorthosilicate hard mask is about 10 nm thick. In one or more embodiments, a trench is etched into the tetraethylorthosilicate hard mask under the portion of the cavity that is not filled by the spin-on glass. In one or more embodiments, the substrate further includes a titanium nitride hard mask, wherein the trench is etched into the titanium nitride hard mask. In one or more embodiments, the titanium nitride hard mask is about 20 nm thick.

In one or more embodiments, the substrate includes a base layer of silicon carbonitride. In one or more embodiments, the base layer is about 8 nm thick.

In one or more embodiments, the substrate includes a body layer of silicon cyanate. In one or more embodiments, the body layer is about 40 nm thick.

In one or more embodiments, the substrate includes a covering layer of SAC nitride. In one or more embodiments, the covering layer is about 20 nm thick.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a substrate;
a spacer protruding from the substrate and surrounding a cavity; and
spin-on glass filling a portion of the cavity where, in the portion of the cavity filled with the spin-on glass, the spin-on glass directly contacts the spacer.

2. The semiconductor structure of claim 1, wherein the substrate comprises a tetraethylorthosilicate hard mask under the spacer.

3. The semiconductor structure of claim 2, wherein the tetraethylorthosilicate hard mask is about 10 nm thick.

4. The semiconductor structure of claim 2, wherein a trench is etched into the tetraethylorthosilicate hard mask under the portion of the cavity that is not filled by the spin-on glass.

5. The semiconductor structure of claim 4, wherein the substrate further comprises a titanium nitride hard mask, and wherein the trench is etched into the titanium nitride hard mask.

6. The semiconductor structure of claim 5, wherein the titanium nitride hard mask is about 20 nm thick.

7. The semiconductor structure of claim 1, wherein the substrate comprises a base layer of silicon carbonitride.

8. The semiconductor structure of claim 7, wherein the base layer is about 8 nm thick.

9. The semiconductor structure of claim 1, wherein the substrate comprises a body layer of silicon cyanate.

10. The semiconductor structure of claim 9, wherein the body layer is about 40 nm thick.

11. The semiconductor structure of claim 1, wherein the substrate comprises a covering layer of silicon nitride.

12. The semiconductor structure of claim 11, wherein the covering layer is about 20 nm thick.

13. The semiconductor structure of claim 1, wherein the spacer fully surrounds the cavity.

\* \* \* \* \*